United States Patent
Tu et al.

(10) Patent No.: US 7,704,760 B2
(45) Date of Patent: *Apr. 27, 2010

(54) METHOD OF MAKING LIGHT EMITTING DIODE WITH IRREGULAR SURFACE AND INDEPENDENT VALLEYS

(75) Inventors: Chuan-Cheng Tu, Taipei (TW); Pao-I Huang, Chiayi (TW); Jen-Chau Wu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/231,164

(22) Filed: Aug. 29, 2008

(65) Prior Publication Data

US 2009/0029492 A1 Jan. 29, 2009

Related U.S. Application Data

(60) Continuation of application No. 10/957,738, filed on Oct. 4, 2004, now Pat. No. 7,435,604, which is a division of application No. 10/657,379, filed on Sep. 8, 2003, now abandoned.

(51) Int. Cl.
*H01L 21/00* (2006.01)
(52) U.S. Cl. ............................ 438/22; 257/E33.058
(58) Field of Classification Search ............. 438/22–27; 257/79–84, 98, 432, E33.067, E33.058
See application file for complete search history.

(56) References Cited

U.S. PATENT DOCUMENTS

| | | | |
|---|---|---|---|
| 4,532,631 A | 7/1985 | Shima et al. | |
| 5,793,060 A * | 8/1998 | Morikawa | 257/85 |
| 6,583,442 B2 | 6/2003 | Ito | |
| 6,674,098 B1 | 1/2004 | Niki et al. | |
| 6,809,340 B2 | 10/2004 | Kato et al. | |
| 6,821,810 B1 * | 11/2004 | Hsiao et al. | 438/69 |
| 6,881,979 B2 * | 4/2005 | Starikov et al. | 257/80 |
| 6,921,928 B2 * | 7/2005 | Sonobe | 257/99 |
| 6,924,515 B2 * | 8/2005 | Senda et al. | 257/189 |
| 6,969,899 B2 * | 11/2005 | Yaung et al. | 257/436 |
| 6,982,438 B2 * | 1/2006 | Ishizaki | 257/103 |
| 6,982,469 B2 * | 1/2006 | Kondo et al. | 257/432 |
| 6,995,800 B2 * | 2/2006 | Takahashi et al. | 348/340 |
| 2004/0051109 A1 * | 3/2004 | Ishizaki et al. | 257/89 |
| 2004/0087050 A1 | 5/2004 | Uemura et al. | |
| 2005/0001223 A1 | 1/2005 | Linder et al. | |
| 2005/0035354 A1 | 2/2005 | Lin et al. | |

FOREIGN PATENT DOCUMENTS

JP 04061184 A 2/1992

* cited by examiner

*Primary Examiner*—Nathan W Ha
(74) *Attorney, Agent, or Firm*—Kinney & Lange, P.A.

(57) ABSTRACT

A method of making a light emitting diode (LED) is disclosed. The LED of the present invention comprises a semiconductor layer of a first polarity, an active layer, and a semiconductor layer of a second polarity stacked from bottom to up, wherein a stacked structure at least composed of the active layer and the semiconductor layer of the second polarity have a side with a wave-shape border in a top view of the LED and/or at least one valley, thereby increasing the efficiency of emitting the light to the outside of the LED.

27 Claims, 4 Drawing Sheets

METHOD OF MAKING LIGHT EMITTING DIODE WITH IRREGULAR SURFACE AND INDEPENDENT VALLEYS

This application is a continuation of U.S. patent application Ser. No. 10/957,738, filed on Oct. 4, 2004, for "Method of Making Light Emitting Diode" by Chuan-Cheng Tu, Pao-I Huang, and Jen-Chau Wu, which in turn is a division of U.S. patent application Ser. No. 10/657,379, filed on Sep. 8, 2003, for "Light Emitting Diode and Method of Making the Same" by Chuan-Cheng Tu, Pao-I Huang, and Jen-Chau Wu.

FIELD OF THE INVENTION

The present invention relates to a light emitting diode (LED) and a method of making the same, and more particularly, to a LED having a side of irregular shape and a method of making the LED.

BACKGROUND

In recent years, InGaN LED is getting popular owing to its excellent performance in blue and green light regions. The solid-state light source application has made the InGaN LED in tremendous importance, wherein it is already used in keypad, back-lighting in cell phone, car lighting, decoration, and many other areas. However, the total output luminance efficiency is still not enough to enter general lighting applications. Regarding LED of high brightness, its output luminance efficiency can be divided into two parts: internal quantum efficiency and external quantum efficiency. The internal quantum efficiency is determined by the ratio of photons generated versus electrons and hole carriers injected. Thanking to the outstanding performance of the recent commercial organic metallic vapor phase epitaxy (OMVPE) equipment, the internal quantum efficiency can almost reach to 100% of the theoretical value. However, in InGaN LED devices, the external quantum efficiency is generally less than 30%. One major reason is that active quantum layers absorb the generated lights, and most of the generated lights are reflected by four edge surfaces and top and bottom surfaces of the chip. That is, light will be reflected totally by the chip's surface when the light incident angle is grater than the total reflection angle of the chip's surface (about 23 degrees from the axis of the surface plane).

Please simultaneously refer to FIG. 1A showing the top view of the conventional nitride LED, and to FIG. 1B showing the side view of the conventional nitride LED. A LED 80 shown in FIG. 1A and FIG. 1B can be formed via the following steps. Firstly, a substrate 10 is provided, wherein the material of the substrate 10 is such as sapphire, GaN, AlN, etc. Then, a semiconductor layer 30 of a first polarity, an active layer 40, a semiconductor layer 50 of a second polarity, and a contact layer 55 are sequentially epitaxially grown on the substrate 10. Afterwards, the aforementioned epitaxial layers are etched, thereby exposing a portion of the semiconductor layer 30 of the first polarity. Then, an electrode 60 of the first polarity and an electrode 70 of the second polarity are deposited respectively on the exposed portion of the semiconductor layer 30 of the first polarity and the contact layer 55 via thermal evaporation, e-beam evaporation, or sputtering, etc.

Such as shown in the top view of FIG. 1A, after the light rays emitted from point d and point e in the active layer (not shown) respectively is totally reflected several times by the boundary, the light is still not emitted out of the LED 80. Besides, such as shown in the side view of FIG. 1B, even though the light rays respectively emitted from point f and point g in the active layer 40 can eventually be emitted out of the LED 80, most of the light rays have been absorbed by all layers of the LED 80 and only few light rays can actually go outside the LED 80 since the light rays have been totally reflected several times. Hence, there is a need to find a solution for the aforementioned problem.

SUMMARY

Consequently, an objective of the present invention is to provide a LED and a method of making the same, thereby reducing the possible times of reflecting the light emitted from the active layer, thus making light emitted from the active layer penetrate through the irregular side and be emitted out of the LED.

According to the aforementioned objectives of the present invention, the present invention provides a method of making a LED, comprising: providing a semiconductor layer of a first polarity; forming an active layer on the semiconductor layer of the first polarity; and forming a semiconductor layer of a second polarity on the active layer, wherein at least one side of a stacked structure at least composed of the active layer and the semiconductor layer of the second polarity has a wave-shape border in a top view of the LED, thereby reducing the probability of reflecting the light emitted from the active layer, thus making light emitted from the active layer penetrate through the at least one side and be emitted outside the LED, wherein the wave-shape border is formed from an etched surface, and the etched surface is formed by employing one single mask. Moreover, the wave-shape border in the top view of the LED can be triangular wave-shape border, semicircular wave-shape border, or parabolic wave-shape border, etc. Furthermore, the stacked structure therein further have at least one valley penetrating from an upper surface of the semiconductor layer of the second polarity to a lower surface of the active layer, thereby increasing an efficiency of emitting the light emitted from the active layer to the outside of the LED.

According to the aforementioned objectives of the present invention, the present invention provides another method of making a LED comprising: providing a semiconductor layer of a first polarity; forming an active layer on the semiconductor layer of the first polarity; and forming a semiconductor layer of a second polarity on the active layer, wherein a stacked structure at least composed of the active layer and the semiconductor layer of the second polarity therein further have at least one valley penetrating from an upper surface of the semiconductor layer of the second polarity to a lower surface of the active layer, thereby increasing an efficiency of emitting the light emitted from the active layer to the outside of the LED. Moreover, at least one side of the stacked structure has an uneven surface, wherein the uneven surface of the at least one side in a top view of the LED has a wave-shape border, thereby reducing the probability of reflecting the light emitted from the active layer, thus making light emitted from the active layer penetrate through the at least one side and be emitted outside the LED. Furthermore, the irregular shape of the aforementioned side can be triangular wave-shape border, semicircular wave-shape border, or parabolic wave-shape border, etc.

According to the aforementioned objectives of the present invention, the present invention provides a method of making a LED, comprising: providing a semiconductor layer of a first polarity; forming an active layer on the semiconductor layer of a first polarity; and forming a semiconductor layer of a second polarity on the active layer, wherein at least one side of at least the active layer and the semiconductor layer of the second polarity is of irregular shape, thereby reducing the probability of reflecting the light emitted from the active layer, thus making light emitted from the active layer penetrate through the at least one side and be emitted outside the LED. Moreover, the irregular shape of the aforementioned side can be triangle, semicircle, or parabola, etc. Furthermore, at least the active layer and the semiconductor layer of the second polarity therein further have at least one valley penetrating from an upper surface of the semiconductor layer of the second polarity to a lower surface of the active layer, thereby increasing an efficiency of emitting the light emitted from the active layer to the outside of the LED.

According to the aforementioned objectives of the present invention, the present invention provides another method of making a LED comprising: providing a semiconductor layer of a first polarity; forming an active layer on the semiconductor layer of the first polarity; and forming a semiconductor layer of a second polarity on the active layer, wherein at least the active layer and the semiconductor layer of the second polarity therein further have at least one valley penetrating from an upper surface of the semiconductor layer of the second polarity to a lower surface of the active layer, thereby increasing an efficiency of emitting the light emitted from the active layer to the outside of the LED. Moreover, the at least one side of at least the active layer and the semiconductor layer of the second polarity is of irregular shape, thereby reducing the probability of reflecting the light emitted from the active layer, thus making light emitted from the active layer penetrate through the at least one side and be emitted outside the LED. Furthermore, the irregular shape of the aforementioned side can be triangle, semicircle, or parabola, etc.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1A:
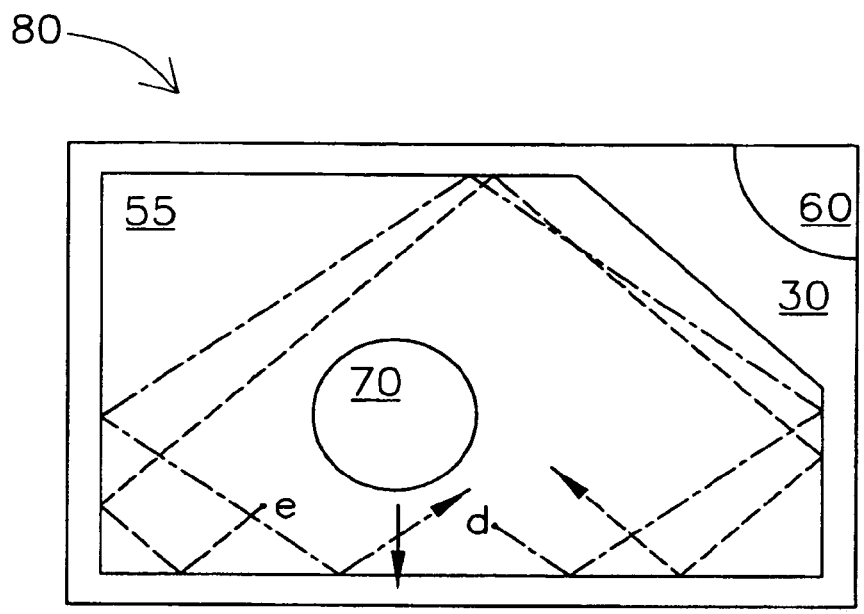
FIG. 1A is a diagram showing the top view of the conventional LED.
Figure 1B:
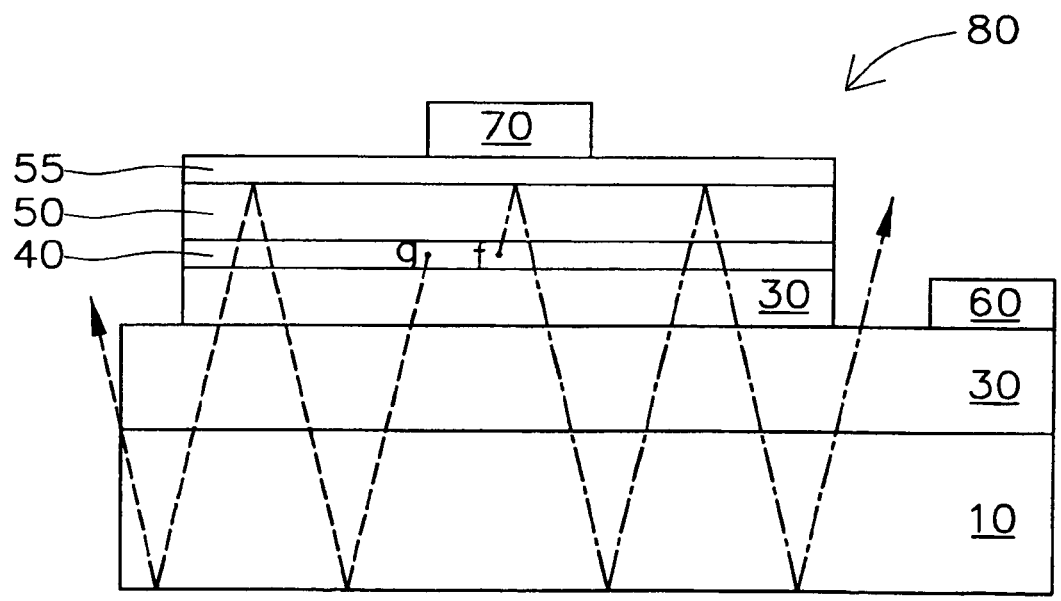
FIG. 1B is a diagram showing the side view of the conventional LED.
Figure 2A:
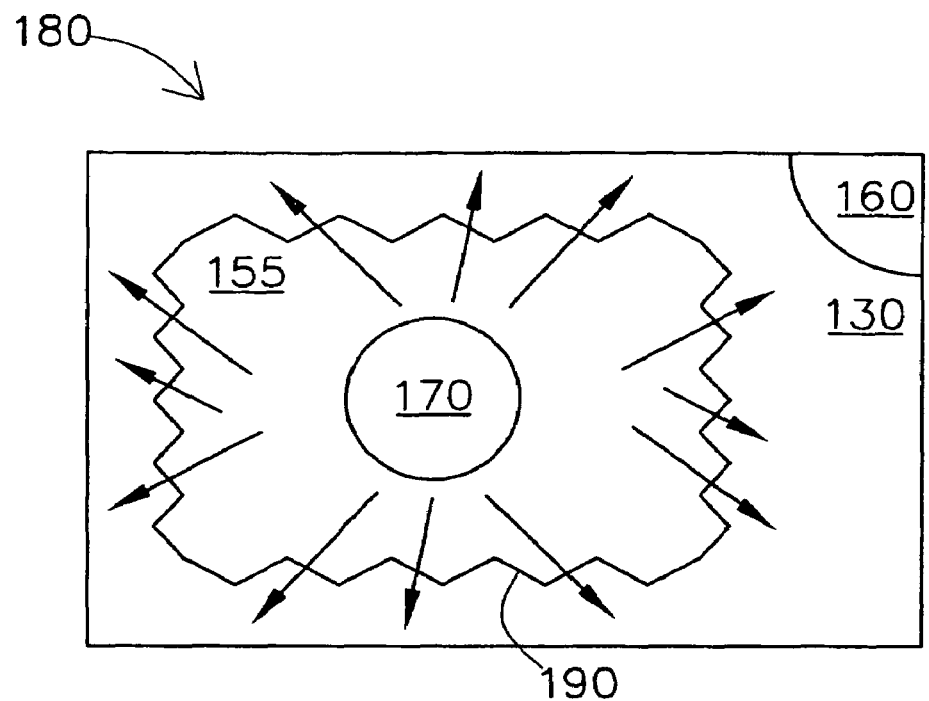
FIG. 2A is a diagram showing the top view of the LED according to an embodiment of the present invention.
Figure 2B:
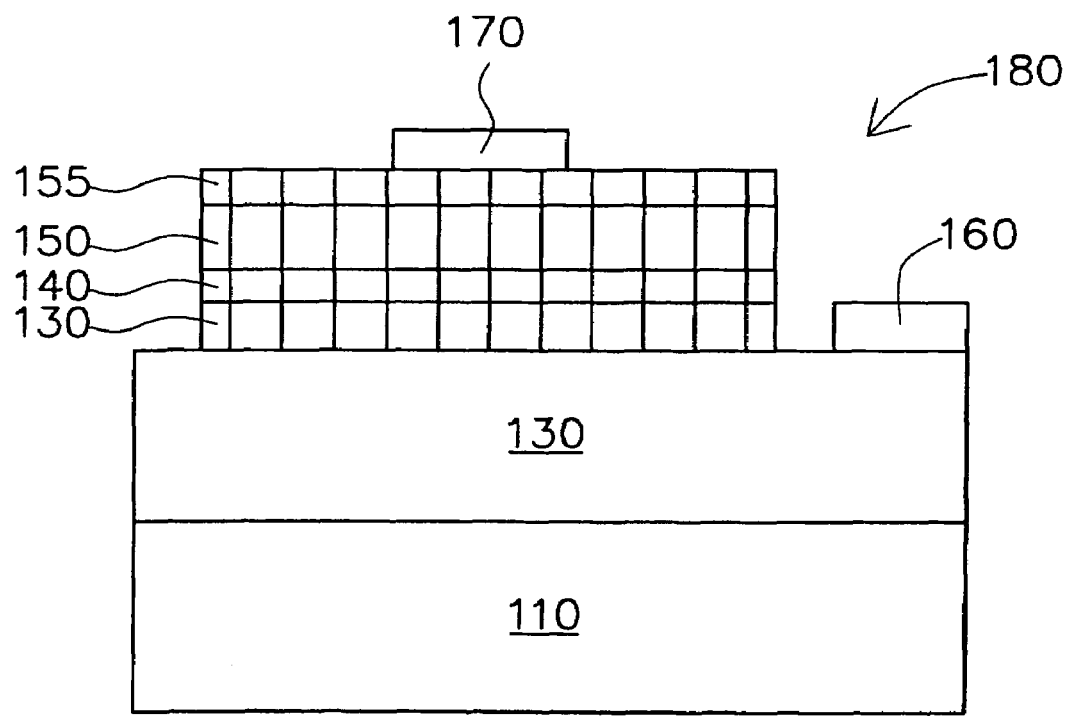
FIG. 2B is a diagram showing the side view of the LED according to the embodiment of the present invention.

The present invention relates to a method of making the LED having a side of irregular shape. Please refer to FIG. 2A showing the top view of the LED according to an embodiment of the present invention, and to FIG. 2B showing the side view of the LED according to the embodiment of the present invention simultaneously. A LED 180 shown in FIG. 2A and FIG. 2B can be formed via the following steps. Firstly, a substrate 110 is provided, wherein the material of the substrate 110 is such as sapphire, GaN, AlN, etc. Then, a semiconductor layer 130 of a first polarity, an active layer 140, a semiconductor layer 150 of a second polarity, and a contact layer 155 are sequentially epitaxially grown on the substrate 110, wherein the semiconductor layer 130 of the first polarity and the semiconductor layer 150 of the second polarity can be made of GaN, etc., and the active layer 140 can be made of InGaN, etc. Afterwards, in a photolithography process, a mask having pattern of triangular wave-shape border 190 is used to define the portion needed to be removed in the subsequent etching process. Then, reactive ion etching (RIE) etc. can be used to remove a portion of the contact layer 155, the semiconductor layer 150 of the second polarity, and the active layer 140 outside the triangular wave-shape border 190 orderly from top to bottom, thereby exposing a portion of the upper surface of the semiconductor layer 130 of the first polarity. At the same time, if the etching time is long enough, a portion of the thickness of the semiconductor layer 130 of the first polarity can be further removed in this etching process, thereby forming the side view of the contact layer 155, the semiconductor layer 150 of the second polarity, the active layer 140, and the semiconductor layer 130 of the first polarity, such as shown in FIG. 2B. Afterwards, an electrode 160 of the first polarity and an electrode 170 of the second polarity are deposited respectively on the exposed portion of the semiconductor layer 130 of the first polarity and the contact layer 155 via thermal evaporation, e-beam evaporation, or sputtering, etc. It is worthy to be described that both the first polarity and the second polarity mentioned in the present invention are mutually opposite in polarity. For example, the second polarity is N type while the first polarity is P type; the second polarity is P type while the first polarity is N type.

The present invention is featured in that the contact layer 155, the semiconductor layer 150 of the second polarity, and the active layer 140 (even including a portion of the semiconductor layer 130 of the first polarity) shown in FIG. 2A and FIG. 2B have triangular wave-shape border 190 in the top view of the LED 180. The pattern having triangular wave-shape border 190 can be defined by using the same mask used in the photolithography process before the aforementioned etching process. Moreover, the deformed dimension of the triangular wave-shape border 190 is greater than the equivalent emitting wavelength of the LED 180; and the incident angle of the light emitted from the active layer 140 to the triangular wave-shape border 190 is less then the reflective critical angle of the triangular wave-shape border 190. Consequently, with the use of the LED 180 having the triangular wave-shape border 190 and the method of making the same, the probability of reflecting the light emitted from the active layer 140 by the triangular wave-shape border 190 can be reduced, thereby making light emitted from the active layer 140 penetrate through the triangular wave-shape border 190 and be emitted outside the LED 180.

Figure 3A:
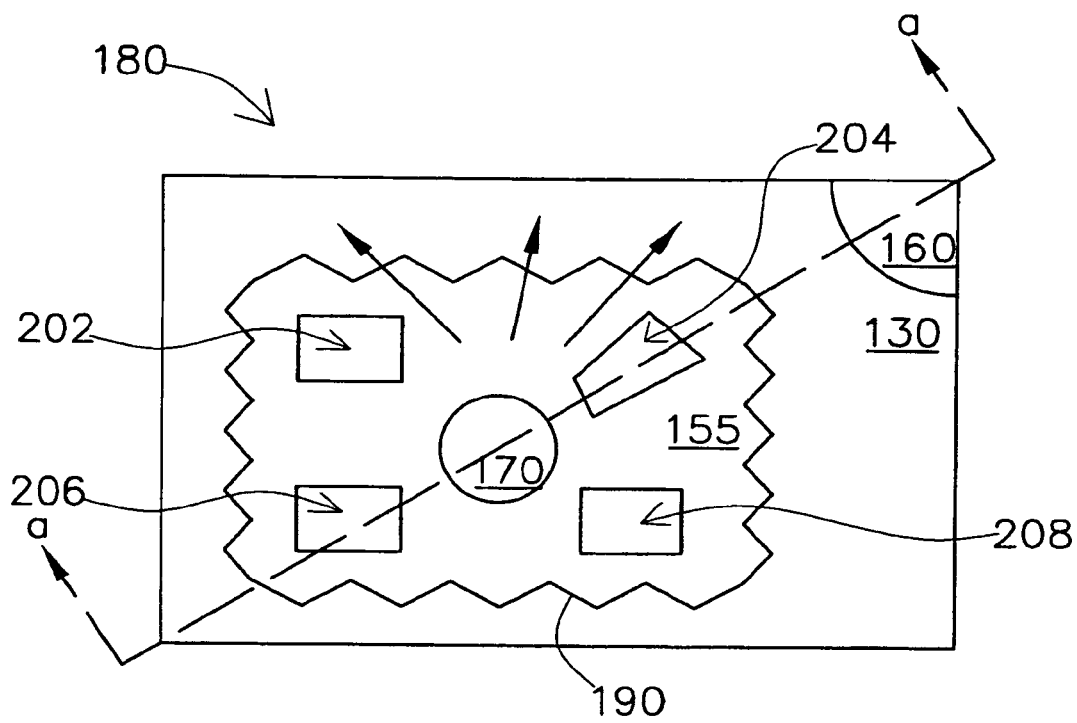
FIG. 3A is a diagram showing the top view of the LED according to another embodiment of the present invention.
Figure 3B:
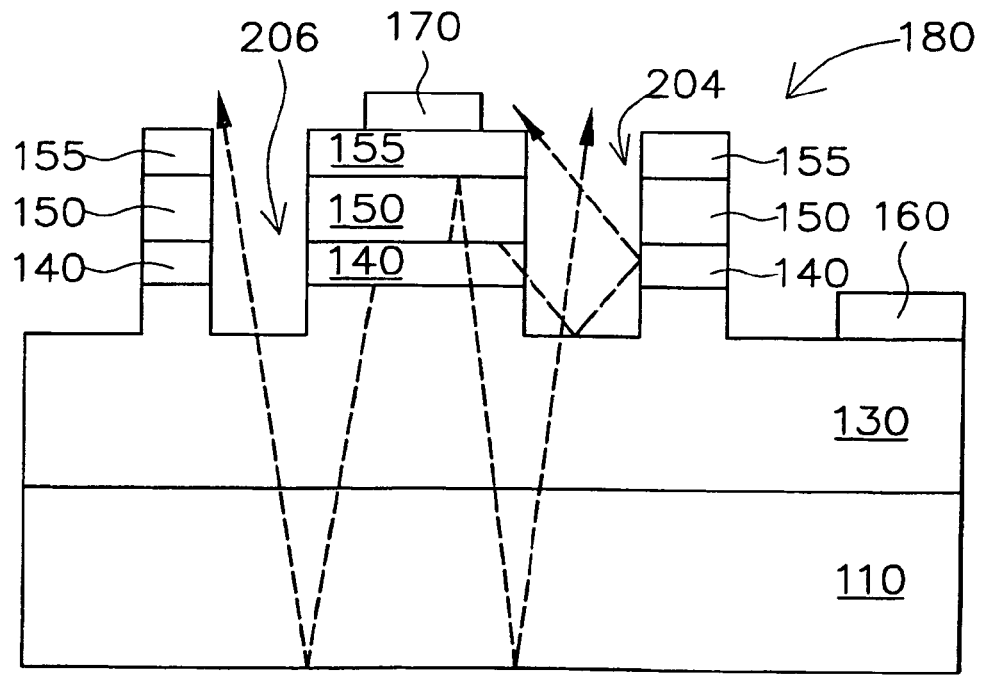
FIG. 3B is a diagram showing the cross section viewed along the a-a' line in FIG. 3A.

In addition, the contact layer 155, the semiconductor layer 150 of the second polarity, and the active layer 140 (even including a portion of the semiconductor layer 130 of the first polarity) in the present invention further have at least one vertical injection valley. Please refer to FIG. 3A showing the top view of the LED according to another embodiment of the present invention, and to FIG. 3B showing the cross section viewed along the a-a' line in FIG. 3A. As shown in FIG. 3A and FIG. 3B, the contact layer 155, the semiconductor layer 150 of the second polarity, and the active layer 140 (even including a portion of the semiconductor layer 130 of the first polarity) therein have a valley 202, a valley 204, a valley 206, and a valley 208, etc. penetrating from an upper surface of the contact layer 155 to a lower surface of the active layer 140 and reaching into a portion of the semiconductor layer 130 of the first polarity, even penetrating the whole thickness of the semiconductor layer 130 and reaching to an upper surface of the substrate 110, thereby increasing an efficiency of emitting the light emitted from the active layer 140 to the outside of the LED 180. Besides, the shape of the inner surface of the valley 202, that of the valley 204, that of the valley 206, and that of the valley 208, etc. are not limited; and certainly the wave-shape border, such as the triangular wave-shape border 190, can be also adopted for further reducing the opportunity of reflecting the light.

Figure 4:
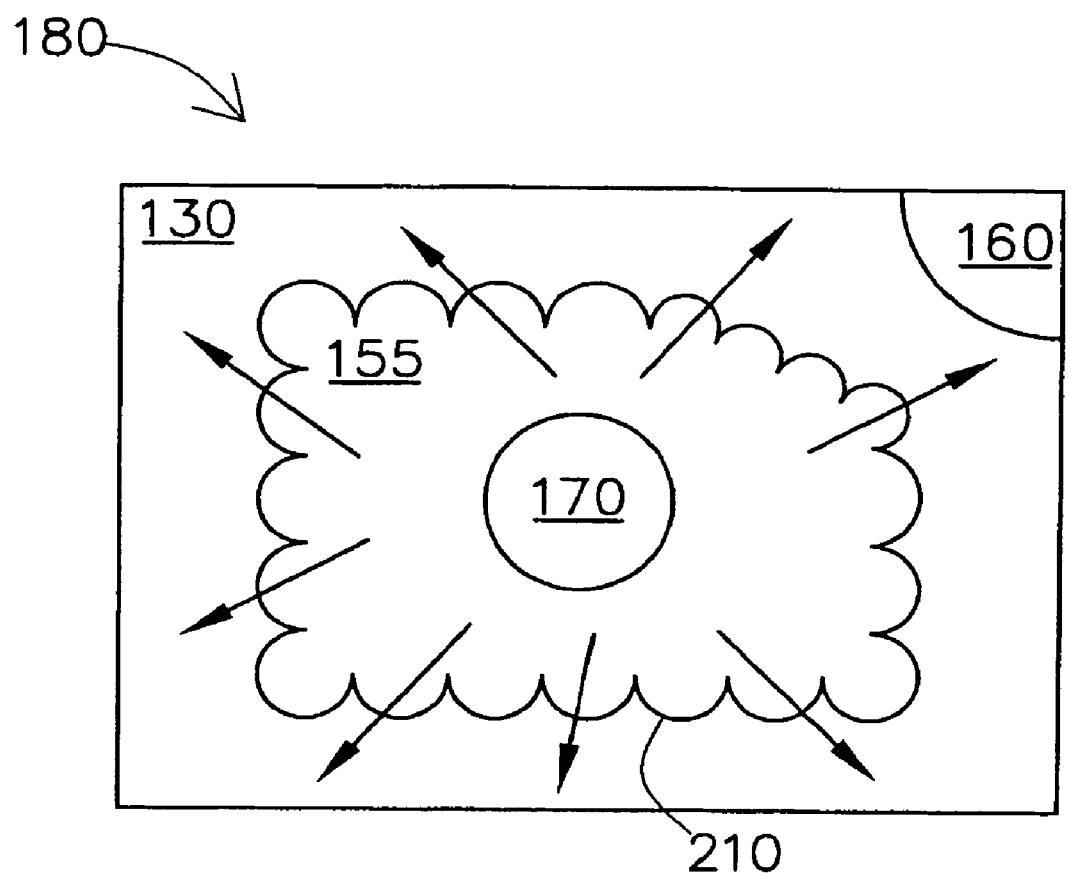
FIG. 4 is a diagram showing the top view of the LED according to still another embodiment of the present invention.

Furthermore, the wave-shape border of LED's side is not limited to triangular wave-shape border. As shown in FIG. 4, the elements (such as the contact layer 155) of the LED 180 etc. can also be the side of other shapes, such as semicircular wave-shape border 210 or parabolic wave-shape border, etc. Any shape wave-shape border is within the claimed scope of the present invention provided that the probability of totally reflecting the light by the side can be reduced.

To sum up, an advantage of the present invention is to provide a LED and a method or making the same, thereby reducing the probability of reflecting the light emitted from the active layer, thus making light emitted from the active layer penetrate through the irregular side and be emitted outside the LED.

As is understood by a person skilled in the art, the foregoing preferred embodiments of the present invention are illustrations of the present invention rather than limitations of the present invention. It is intended to cover various modifications and similar arrangements comprised within the spirit and scope of the appended claims, the scope of which should be accorded the broadest interpretation so as to encompass all such modifications and similar structure.

The invention claimed is:

1. A method of making a light-emitting diode (LED), comprising:
    providing a semiconductor layer of a first polarity;
    forming an active layer on the semiconductor layer of the first polarity; and
    forming a semiconductor layer of a second polarity on the active layer,
    wherein at least one side of a stacked structure at least composed of the active layer and the semiconductor layer of the second polarity comprises an irregular surface, and the irregular surface comprises a deformed dimension greater than an emitting wavelength of the LED for making light emitted from the active layer outside the LED, and
    wherein a plurality of independent valleys extend from an upper surface of the semiconductor layer of the second polarity to the active layer.

2. The method of making the LED according to claim 1, further comprising providing a substrate before providing the semiconductor layer of the first polarity, wherein the semiconductor layer of the first polarity is located on the substrate, and the plurality of independent valleys further reach to an upper surface of the substrate.

3. The method of making the LED according to claim 1, wherein the semiconductor layer of the first polarity is made of GaN.

4. The method of making the LED according to claim 1, wherein the active layer is made of InGaN.

5. The method of making the LED according to claim 1, wherein the semiconductor layer of the second polarity is made of GaN.

6. The method of making the LED according to claim 1, wherein the irregular surface of the at least one side in the top view of the LED has a wave-shape border.

7. The method of making the LED according to claim 6, wherein the wave-shape border in the top view of the LED is selected from a group consisting of triangular wave-shape border, semicircular wave-shape border, and parabolic wave-shape border.

8. The method of making the LED according to claim 6, wherein the irregular surface is formed by reactive ion etching.

9. The method of making the LED according to claim 1, wherein the plurality of independent valleys have different shapes.

10. The method of making the LED according to claim 9, wherein the shapes are selected from a group consisting of triangular wave-shape border, semicircular wave-shape border, and parabolic wave-shape border.

11. The method of making the LED according to claim 1, wherein the plurality of independent valleys expose the at least one side of the stacked structure.

12. A method of making a LED, comprising:
    providing a semiconductor layer of a first polarity;
    forming an active layer on the semiconductor layer of the first polarity; and
    forming a semiconductor layer of a second polarity on the active layer,
    wherein at least one side of a stacked structure at least composed of the active layer and the semiconductor layer of the second polarity comprises an irregular surface for making light emitted from the active layer outside the LED, and
    wherein a plurality of independent valleys penetrates the semiconductor layer of the second polarity.

13. The method of making the LED according to claim 12, wherein the plurality of independent valleys have different shapes.

14. The method of making the LED according to claim 13, wherein the shapes are selected from a group consisting of triangular wave-shape border, semicircular wave-shape border, and parabolic wave-shape border.

15. The method of making the LED according to claim 12, wherein the plurality of independent valleys expose the at least one side of the stacked structure.

16. A method of making a LED, comprising:
    providing a semiconductor layer of a first polarity;
    forming an active layer on the semiconductor layer of the first polarity;
    forming a semiconductor layer of a second polarity on the active layer; and
    forming a plurality of independent valleys in the semiconductor layer of the second polarity,
    wherein at least one side of a stacked structure at least composed of the active layer and the semiconductor layer of the second polarity comprises an irregular surface, and the irregular surface comprises a deformed dimension greater than an emitting wavelength of the LED for making light emitted from the active layer outside the LED.

17. The method of making the LED according to claim 16, the plurality of independent valleys further reach the active layer.

18. The method of making the LED according to claim 16, further comprising providing a substrate before providing the semiconductor layer of the first polarity, wherein the semiconductor layer of the first polarity is located on the substrate, and the plurality of independent valleys further reach the substrate.

19. The method of making the LED according to claim 16, wherein the semiconductor layer of the first polarity is made of GaN.

20. The method of making the LED according to claim 16, wherein the active layer is made of InGaN.

21. The method of making the LED according to claim 16, wherein the semiconductor layer of the second polarity is made of GaN.

22. The method of making the LED according to claim 16, wherein the irregular surface of the at least one side in the top view of the LED has a wave-shape border.

23. The method of making the LED according to claim 22, wherein the wave-shape border in the top view of the LED is selected from a group consisting of triangular wave-shape border, semicircular wave-shape border, and parabolic wave-shape border.

24. The method of making the LED according to claim 22, wherein the irregular surface is formed by reactive ion etching.

25. The method of making the LED according to claim 16, wherein the plurality of independent valleys have different shapes.

26. The method of making the LED according to claim 25, wherein the shapes are selected from a group consisting of triangular wave-shape border, semicircular wave-shape border, and parabolic wave-shape border.

27. The method of making the LED according to claim 14, wherein the plurality of independent valleys expose the at least one side of the stacked structure.

* * * * *